United States Patent
Valin et al.

(10) Patent No.: US 7,200,711 B2
(45) Date of Patent: *Apr. 3, 2007

(54) APPARATUS AND METHOD FOR PLACING MEMORY INTO SELF-REFRESH STATE

(75) Inventors: Steven J. Valin, Nevada City, CA (US); Brad A. Reger, Dublin, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 481 days.

This patent is subject to a terminal disclaimer.

(21) Appl. No.: 10/407,533

(22) Filed: Apr. 4, 2003

(65) Prior Publication Data

US 2004/0034732 A1 Feb. 19, 2004

Related U.S. Application Data

(63) Continuation-in-part of application No. 10/219,376, filed on Aug. 15, 2002.

(51) Int. Cl.
G06F 12/16 (2006.01)
(52) U.S. Cl. .................................... 711/106
(58) Field of Classification Search ................ 711/106; 365/194, 222
See application file for complete search history.

(56) References Cited

U.S. PATENT DOCUMENTS

| | | | |
|---|---|---|---|
| 4,710,903 A * | 12/1987 | Hereth et al. ............... | 365/194 |
| 4,979,171 A | 12/1990 | Ashley | |
| 5,276,888 A | 1/1994 | Kardach et al. | |
| 5,634,106 A | 5/1997 | Yaezawa et al. | |
| 5,692,202 A | 11/1997 | Kardach et al. | |
| 5,781,784 A | 7/1998 | McKinley | |
| 5,894,446 A * | 4/1999 | Itou ........................... | 365/222 |
| 6,088,762 A * | 7/2000 | Creta ......................... | 711/106 |
| 6,119,200 A | 9/2000 | George | |
| 6,137,743 A | 10/2000 | Kim | |
| 6,212,599 B1 | 4/2001 | Baweja et al. | |
| 6,216,233 B1 * | 4/2001 | Baweja ....................... | 713/322 |
| 6,263,453 B1 | 7/2001 | Anderson | |
| 6,317,657 B1 | 11/2001 | George | |
| 6,633,987 B2 * | 10/2003 | Jain et al. ................... | 713/300 |
| 2002/0026543 A1 | 2/2002 | Tojima et al. | |

OTHER PUBLICATIONS

CompactFlash Association, "Information about CompactFlash", Aug. 21, 2000, 2 pages.
Intel Corporation, "Intel® RAID Controller SRCMR", 2002, 3 pages.
Intel Corporation, "Intel® RAID Controller SRCMR—Product Specifications", 2002, 3 pages.
Intel Corporation, "Press Releases: Intel Announces a Broad Range of New Server-Related Products", 2002, 3 pages.
Cypress Semiconductor Corporation, "Low-Cost 3.3V Zero Delay Buffer", CY2305, CY2309, San Jose CA, Feb. 19, 2002, 12 pages.
Linear Technology, "Micropower Precision Triple Supply Monitors", LTC1326/LTC1326-2.5, Milpitas, CA, 1998, 16 pages.
Raidtec Corporation, "Press Release: Raidtec Launches FlashLinux™ NAS-in-a-Flash™ Software", Aug. 9, 2002, 3 pages.

* cited by examiner

*Primary Examiner*—Pierre Bataille
*Assistant Examiner*—Paul Schlie
(74) *Attorney, Agent, or Firm*—Blakely Sokoloff Taylor & Zafman, LLP

(57) ABSTRACT

A circuit external to a memory controller in a processing system places a dynamic random access memory into a self-refresh state in response to a predetermined condition associated with a power-down or reset event.

26 Claims, 7 Drawing Sheets

APPARATUS AND METHOD FOR PLACING MEMORY INTO SELF-REFRESH STATE

This is a continuation-in-part of copending U.S. patent application Ser. No. 10/219,376, filed on Aug. 15, 2002 and entitled, "Method and Apparatus to Establish Safe State in a Volatile Computer Memory under Multiple Hardware and Software Malfunction Conditions," which is incorporated herein by reference.

FIELD OF THE INVENTION

At least one embodiment of the present invention pertains to controlling a non-volatile memory in a processing system, and more particularly, to placing a non-volatile memory into a self-refresh state.

BACKGROUND

Modern computer-based processing systems all include some kind of processor, memory, and one or more input/output (I/O) devices. Examples of such processing systems are personal computers (PCs), server-class computers, hand-held devices such as personal digital assistants (PDAs), and various types of appliances that connect to networks. The memory in a processing system normally stores data and instructions that are executed by the processor.

In many of these systems, the main memory is usually a form of random access memory (RAM). Most if not all forms of RAM are considered to be volatile, in that they require power to maintain the stored data. The two most common types of RAM are static RAM (SRAM) and dynamic RAM (DRAM). SRAM is static, in that a bit in SRAM can be set to a logic state, and the bit will stay in that state until set to another logic state or power is lost. SRAM is typically very fast in terms of access time; however, it also tends to be expensive.

DRAM is generally much less expensive than SRAM, and therefore, it is often preferred over SRAM for use as main memory in mass-produced processing systems. However, DRAM is dynamic, in that it must periodically be read and re-written to in order to maintain its state. This read/re-write process is called "refreshing". If DRAM is not refreshed, it will lose its contents. Refreshing a typical DRAM requires refresh signals to be applied to the DRAM periodically while power is applied to maintain the data stored in it. Normally, an external circuit such as a memory controller provides the refresh signals to the DRAM. There are various different forms of DRAM, such as synchronous DRAM (SDRAM), double data rate SDRAM (DDR SDRAM), Rambus DRAM (RDRAM), etc.

Under certain conditions, the refresh signals normally applied to DRAM may not be generated. For example, refresh signals typically are not generated during a system reset, which may be done when an error or malfunction has occurred in the processing system (e.g., a system "hang" or "crash"). Modern DRAM typically includes self-refresh capability, however, which allows the DRAM to operate in a self-refresh state under these conditions, in which the DRAM automatically generates its own refresh signals. The self-refresh state is a safe state that preserves the stored data.

Many common conditions under which the external refresh signals may be lost also involve a loss of power. Examples of such conditions are a manually-executed power-down of a computer system that is otherwise operating properly, or an unexpected interruption or loss of power to the computer system. Even if the DRAM is placed into the self-refresh state, the data stored in it will be lost if power to the DRAM is not maintained. By powering the DRAM from an auxiliary uninterruptible power source under these conditions, such as a battery, the stored data can be maintained, in the self-refresh state. DRAM consumes much less power in the self-refresh state than in the normal state, which helps to conserve battery power.

Many processing systems have the ability to perform a software-initiated power-down or reset, which can include placing DRAM into the self-refresh state. However, because many error conditions under which this might occur are software related, it is undesirable to have to rely upon software to place DRAM into the self-refresh state, especially for systems in which it is crucial to prevent loss of data.

SUMMARY OF THE INVENTION

The present invention includes an apparatus that comprises a comprises a memory controller to control a random access memory that has self-refresh capability, and a self-refresh circuit external to the memory controller to place the memory into a self-refresh state.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Circuitry which is external to a memory controller to place non-volatile DRAM into a self-refresh state is described below. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

Figure 1:
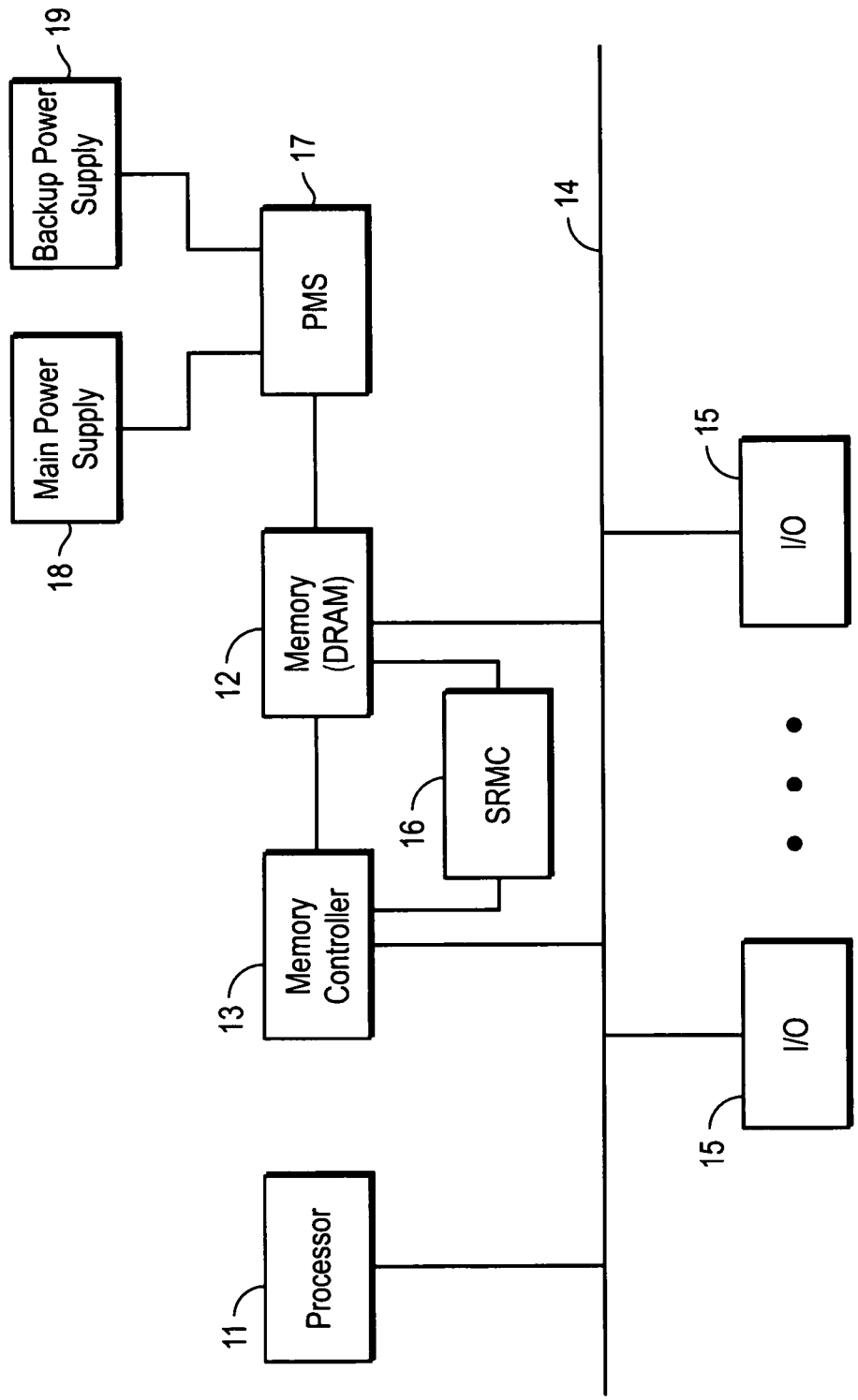
FIG. 1 illustrates a processing system in which self-refresh management circuitry (SRMC) in accordance with the present invention is included.

FIG. 1 is a high-level illustration of a processing system in which self-refresh management circuitry according to the present invention can be implemented, to place DRAM into a self-refresh state. As shown, the processing system includes one or more processors 11, memory 12, and a memory controller 13 which are coupled to each other on a bus system 14. The bus system 14 can represent one or more buses (e.g., a system bus and one or more I/O or expansion buses) along with one or more bus controllers, bridges and/or adapters. The processing system also includes one or more I/O devices 15, which are coupled to the processor 11 and memory 12 through the bus system 14.

For purposes of this description, assume that memory 12 is a form of DRAM, which has self-refresh capability. It will be recognized, however, that the processing system can also include other types of memory, such as read-only memory (ROM), flash memory, mass storage devices (e.g., disks), or the like. The processing system also includes self-refresh management circuitry (SRMC) 16 coupled to the memory 12 and the memory controller 13, and a power monitor and selector circuit (PMS) 17 coupled to the memory 12 as well as a main power supply 18 and a backup power supply (e.g., battery) 19.

Many error conditions which require placing DRAM into the self-refresh state are software related. Consequently, it is desirable to have the ability to place DRAM into the self-refresh state using a purely hardware-based solution, which is purely deterministic and cannot crash or hang as software can. It is further desirable that the solution can operate at memory bus speeds and is placed between the memory controller and the DRAM, external to both.

As described further below, the SRMC 16 is such a solution. The SRMC 16 can place the memory 12 into the self-refresh state under various different conditions, including a power-down reset condition. The SRMC 16 is used in conjunction with the PMS 17. The PMS 17 normally routes power from the main power supply 18 to the memory 12 but will cause power to the memory 12 to be provided from the backup power supply 19 if the voltage level of the main power supply 18 falls below a predetermined level.

The SRMC 16 and PMS 17 can be particularly useful in a processing system in which it is crucial to prevent loss of stored data and where it is undesirable to rely exclusively upon software to place the DRAM into the self-refresh state. One example of such a processing system is a file server. A file server is a network-connected processing system that stores and manages shared files in a set of storage devices (e.g., disk drives) on behalf of one or more clients. File servers are often used to store backup data and other critical data at an enterprise level. The disks within a file server are typically organized as one or more groups of redundant array of independent/inexpensive disks (RAID). One configuration in which file servers can be used is a network attached storage (NAS) configuration. In a NAS configuration, a file server can be implemented in the form of an appliance that attaches to a network, such as a local area network (LAN) or a corporate intranet. Such a device is sometimes called a "filer". An example of such an appliance is any of the filer products made by Network Appliance, Inc. in Sunnyvale, Calif.

Another type of processing system in which the SRMC 16 and PMS 17 can be implemented advantageously is a storage area network (SAN) storage device. A SAN is a highly efficient (high-speed) network of interconnected, shared storage devices. SAN storage devices are also made by Network Appliance, Inc. One difference between NAS and SAN is that in a SAN, the storage appliance provides a remote host with block-level access to stored data, whereas in a NAS configuration, the file server normally provides clients with only file-level access to stored data.

Figure 2:
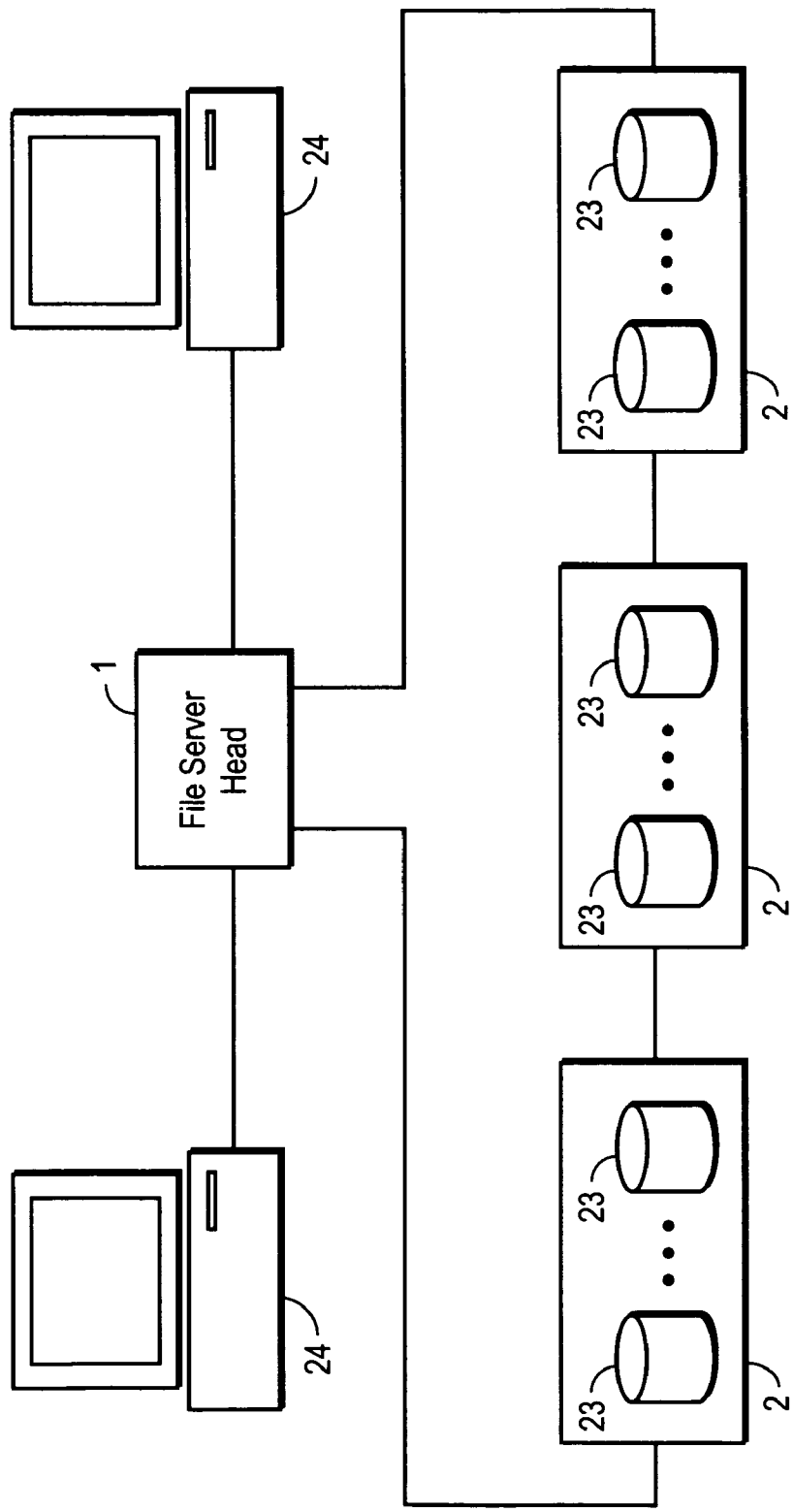
FIG. 2 illustrates a network attached storage (NAS) environment including a network storage server, in which SRMC can be included.

FIG. 2 illustrates a NAS environment including a network file server in which the SRMC 16 and PMS 17 can be included advantageously. Note that while these circuits are now described within the context of a file server, the same approach can be implemented advantageously in a SAN storage device or in essentially any other processing system that uses a form of non-volatile RAM that has self-refresh capability. In FIG. 2, a file server head 1 is connected to a number of sets of disk drives 2 in a loop configuration. Each set of disk drives 2 contains multiple disk drives 23 operated under control of the head 1 as a RAID group. The file server head 1 provides a number of clients 24 with access to shared files stored in the disk drives 23.

In this context, a "head" is all of the hardware (i.e., electronics and supporting infrastructure), firmware and/or software that embodies the "intelligence" used to control access to the mass storage devices (e.g., disk drives); it does not include the mass storage devices themselves. A "head" in this context is not the same as, and is not to be confused with, the magnetic or optical head used to physically read or write data to a disk.

In a file server environment, it is often crucial to prevent any loss of data due to an unanticipated loss or reduction in power, since such systems are often used to store backup data and other critical data. For the reasons described above, it is therefore desirable to have the ability to place DRAM in such a system into the self refresh state in the event of a reset condition that results in a power down of the system. Furthermore, since the malfunctions which often cause such resets are often software related, it is desirable to provide such ability in a software-independent manner. Accordingly, the SRMC 16 and PMS 17 (FIG. 1) can be advantageously included within the file server head 1.

Figure 3:
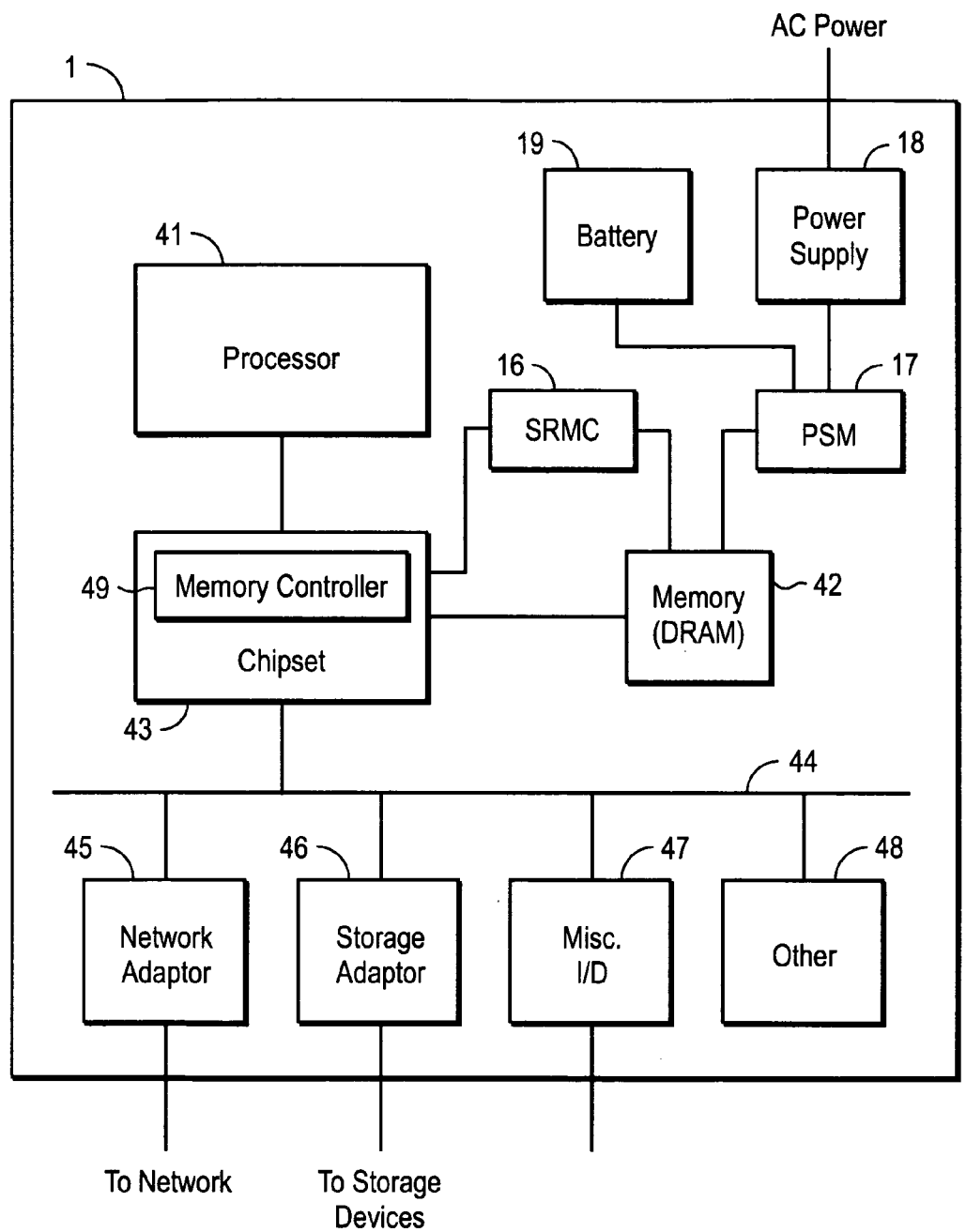
FIG. 3 illustrates a storage server head in which SRMC is implemented.
Figure 4:
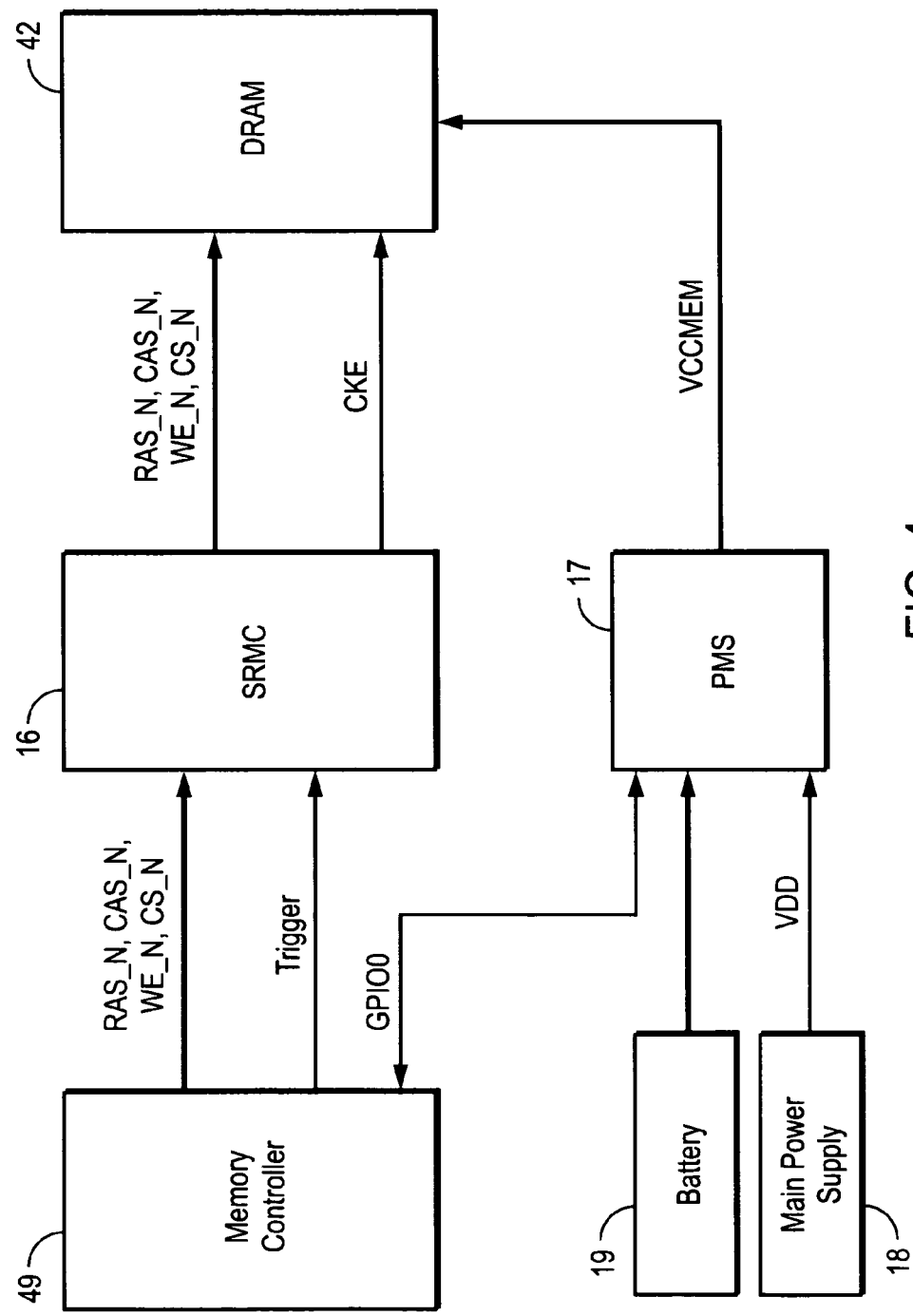
FIG. 4 illustrates the SRMC, according to second embodiment of the invention.

FIG. 3 illustrates the file server head 1 in greater detail, according to certain embodiments. As shown, the head 1 includes a processor 41, memory 42, and a chipset 43 connecting the processor 41 to the memory 42. As in the above description, assume that memory 42 is some form of DRAM, which has self-refresh capability. The chipset 43 also connects a peripheral bus 44 to the processor 41 and memory 42. Also connected to the peripheral bus 44 are one or more network adapters 45, one or more storage adapters 46, one or more miscellaneous I/O components 47, and in some embodiments, one or more other peripheral components 48. The head 1 also includes a main power supply 18 and a backup power supply (e.g., battery) 19. The main power supply 18 receives its power from external AC power applied to the processing system.

The processor 41 is the central processing unit (CPU) of the head 1 and may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

In the illustrated embodiment, the chipset 43 includes a memory controller 49, which performs and supervises read and write transactions on the memory (DRAM) 42. In other embodiments, the memory controller 49 may reside outside the chipset 43, for example, in the processor 41 or as a completely separate component.

The head 1 also includes SRMC 16, which is coupled to the memory 42 and the memory controller 49. The head 1 further includes PMS 17, which is coupled to the memory 42 as well as the main power supply 18 and backup power supply 19.

The chipset 43 may include, in addition to the memory controller 49, one or more bus controllers, bridges and/or adapters. The peripheral bus 44 may be, for example, a Peripheral Component Interconnect (PCI) bus, a Hyper-Transport or industry standard architecture (ISA) bus, a small computer system interface (SCSI) bus, a universal serial bus (USB), or an Institute of Electrical and Electronics Engineers (IEEE) standard 1394 bus (sometimes referred to as "Firewire"). Each network adapter 45 provides the head 1 with the ability to communicate with remote devices, such as clients 24 in FIG. 2, and may be, for example, an Ethernet adapter. Each storage adapter 46 allows the head 1 to access the external disk drives 23 in the various shelves 2 and may be, for example, a Fibre Channel adapter.

FIGS. 4 through 7 further illustrate the SRMC 16 and PMS 17 according to certain embodiments of the invention. In FIGS. 4 through 7, DRAM 42 is implemented in the form of one or more dual in-line memory modules (DIMMs). The SRMC 16 receives a system reset signal, TRIGGER, and a number of memory control signals from the memory controller 49 for controlling the DRAM 42, including a row address strobe (RAS_N) signal, a column address strobe (CAS_N) signal, a write enable (WE_N) signal, and a chip select (CS_N) signal, which are all active-low signals. The SRMC 16 also outputs to the DRAM 42 corresponding signals with these same designations and functions. Depending on the memory configuration, signals RAS_N, CAS_N, WE_N and CS_N in actual practice may be composed of more than one signal each; however only one of each is shown to simplify description.

Under normal operating circumstances, the SRMC 16 simply passes these memory control signals through from the memory controller 49 to the DRAM 42. However, when it is necessary to place the DRAM 42 into the self-refresh state, the SRMC 16 generates these memory control signals internally, provides them to the DRAM 42 while preventing their counterpart signals from the memory controller 49 from being passed through to the DRAM 42.

The PMS 17 receives a one-bit general purpose I/O signal GPIO0 from the memory controller 42, which is used to selectively enable the PMS 17 for battery backup capability. The PMS 17 also receives power VDD from the main internal power supply 18 as well as from the backup power supply 18 and supplies power from one of these sources (normally the main power supply 18) to the DRAM 42.

Figure 5:
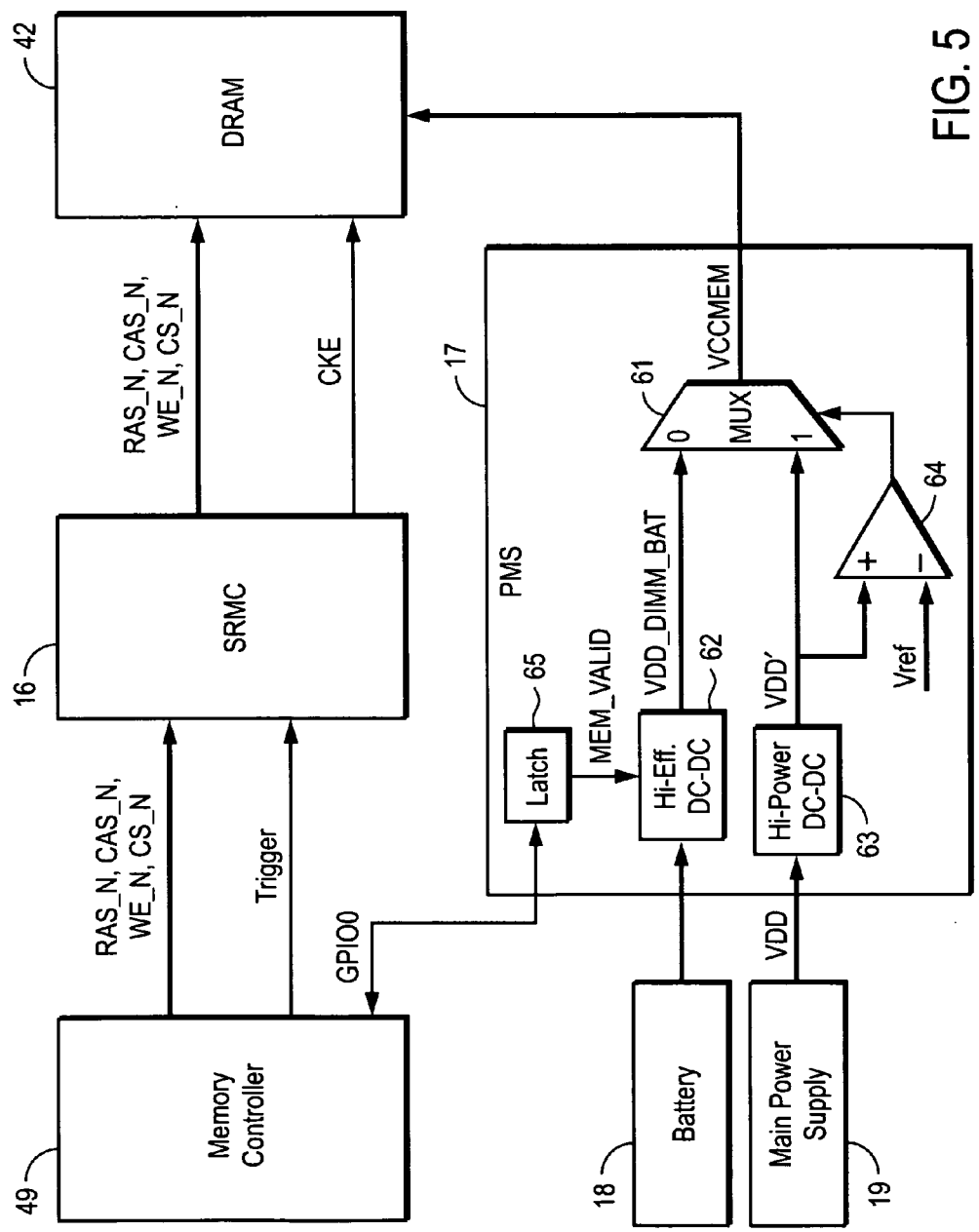
FIG. 5 illustrates the power monitor and selector circuit (PMS) in greater detail.

FIG. 5 illustrates the PMS 17 in greater detail, according to an embodiment of the invention. As shown, the PMS 17 includes a two-input multiplexer 61 (which may be a field effect transistor (FET) switch), a comparator 64, a latch 65, a high-efficiency DC-to-DC converter 62, and a high-power DC-to-DC converter 63. The high-efficiency DC-to-DC converter 62 receives power from the backup power source (e.g., battery) 18 and outputs that power in regulated form VDD_DIMM_BATT to one input of the multiplexer 61. The other input of the multiplexer 61 is the output VDD' of the high-power DC-to-DC converter 63, which receives as input regulated power VDD from the main power supply 18. The output of the high-power DC-to-DC converter 63 is also provided to one input of the comparator 64.

A reference voltage Vref is applied to the other input of the comparator 64 and corresponds to the low-power threshold of the DRAM 42. While the input VDD' of the multiplexer 61 remains above the reference voltage Vref, this input of the multiplexer 61 remains selected as the source of power to the DRAM 42. When VDD' falls below the reference voltage Vref, the comparator 64 outputs a selection signal to the multiplexer 61 to cause the multiplexer 61 to select the battery power input as the source of power to the DRAM 42. Thus, if VDD' (representing the voltage of the main power supply 18) falls below a predetermined level (Vref), the PMS 17 causes power to the DRAM 42 to be provided from the backup power supply 19 instead of the main power supply 18.

The PMS 17 also includes a latch 65, which receives the GPIO0 signal from the memory controller 49 and outputs a MEM_VALID bit to the high-efficiency DC-to-DC converter 62, to enable or disable battery backup capability. Battery backup capability is generally enabled when the data stored in DRAM 42 are valid. In that case, GPIO0 will be asserted, latched by latch 65, and output as MEM_VALID to the high-efficiency DC-to-DC converter 62 to enable battery backup capability.

Figure 6:
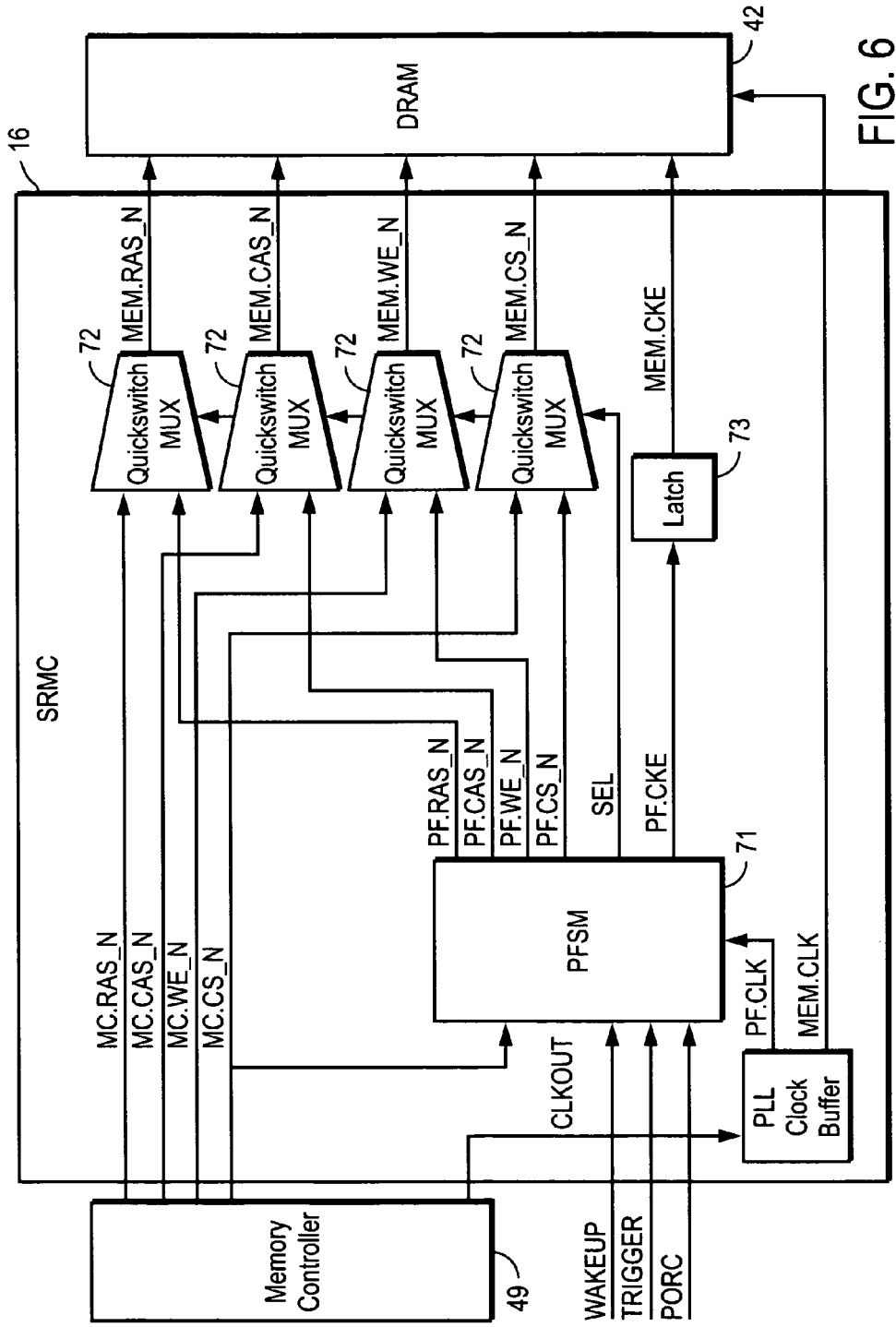
FIG. 6 illustrates the power-fail state machine (PFSM) in greater detail.

FIG. 6 illustrates the SRMC 16 in greater detail, according an embodiment of the invention. As shown, the SRMC 16 includes a power-fail state machine (PFSM) 71, four two-input multiplexers 72, a latch 73, and a phase locked loop (PLL) clock buffer 74. The multiplexers 72 can be made of FETs and preferably provide very little propagation delay. Each of the multiplexers 72 may be, for example, a QS3217 multiplexer from Quality Semiconductor. The PFSM 71 operates to generate counterpart signals to signals RAS_N, CAS_N, WE_N and CS_N from the memory controller 49, for controlling the DRAM 42.

Each of the multiplexers 72 receives one of the memory control signals from the memory controller 49 at one of its inputs and the counterpart of that memory control signal from the PFSM 71. The PFSM 71 outputs a selection signal SEL to each of the multiplexers 72 to select between either the memory control signals from the memory controller 49 or the memory control signals that it generates internally, to be provided to the DRAM 42. When SEL=1, the multiplexers 72 connect the memory control signals from the memory controller 49 to the DRAM 42. When SEL=0, the multiplexers 72 connect the memory control signals from the PFSM 71 to the DRAM 42. For ease of reference, the memory control signals which originate from the memory controller 49 have the prefix "MC", i.e., MC.RAS_N, MC.CAS_N, MC.WE_N and MC.CS_N, whereas the equivalent memory control signals generated by the PFSM 71 have the prefix "PF", i.e., PF.RAS_N, PF.CAS_N, PF.WE_N and PF.CS_N; and the equivalent memory control signals output by the multiplexers 72 have the prefix "MEM", i.e., MEM.RAS_N, MEM.CAS_N, MEM.WE_N and MEM.CS_N.

As described further below, the PFSM 71 operates in response to several input logic signals, including a WAKEUP signal, a TRIGGER signal, and a power on reset circuit (PORC) signal, as well as the MC.CS_N signal from the memory controller 49. The MC.CS_N signal is used by the PFSM 71 to determine if DRAM 42 is idle. The use of the WAKEUP, TRIGGER and PORC signals is discussed below with reference to FIG. 7.

The DRAM 42 requires a clock signal MEM.CLK to function properly. The PLL clock buffer 74 aligns the clock CLKOUT from the memory controller 49 with the MEM.CLK signal to the 42. Many memory controllers will stop the clock soon after a reset occurs. In the event of a system power down or reset, it is necessary to maintain this clock for a certain number of cycles (e.g., about 20, but this depends upon the type of DRAM being used) to allow the PFSM 71 to get the DRAM 42 into the self-refresh state. The PLL clock buffer 74 allows MEM.CLK to run for many cycles (e.g., hundreds) after the clock CLKOUT from the memory controller 49 stops. The DRAM 42 is enabled by a clock enable signal MEM.CKE from the latch 73, the input of which is the clock enable signal PF.CKE output by the PFSM 71.

Figure 7:
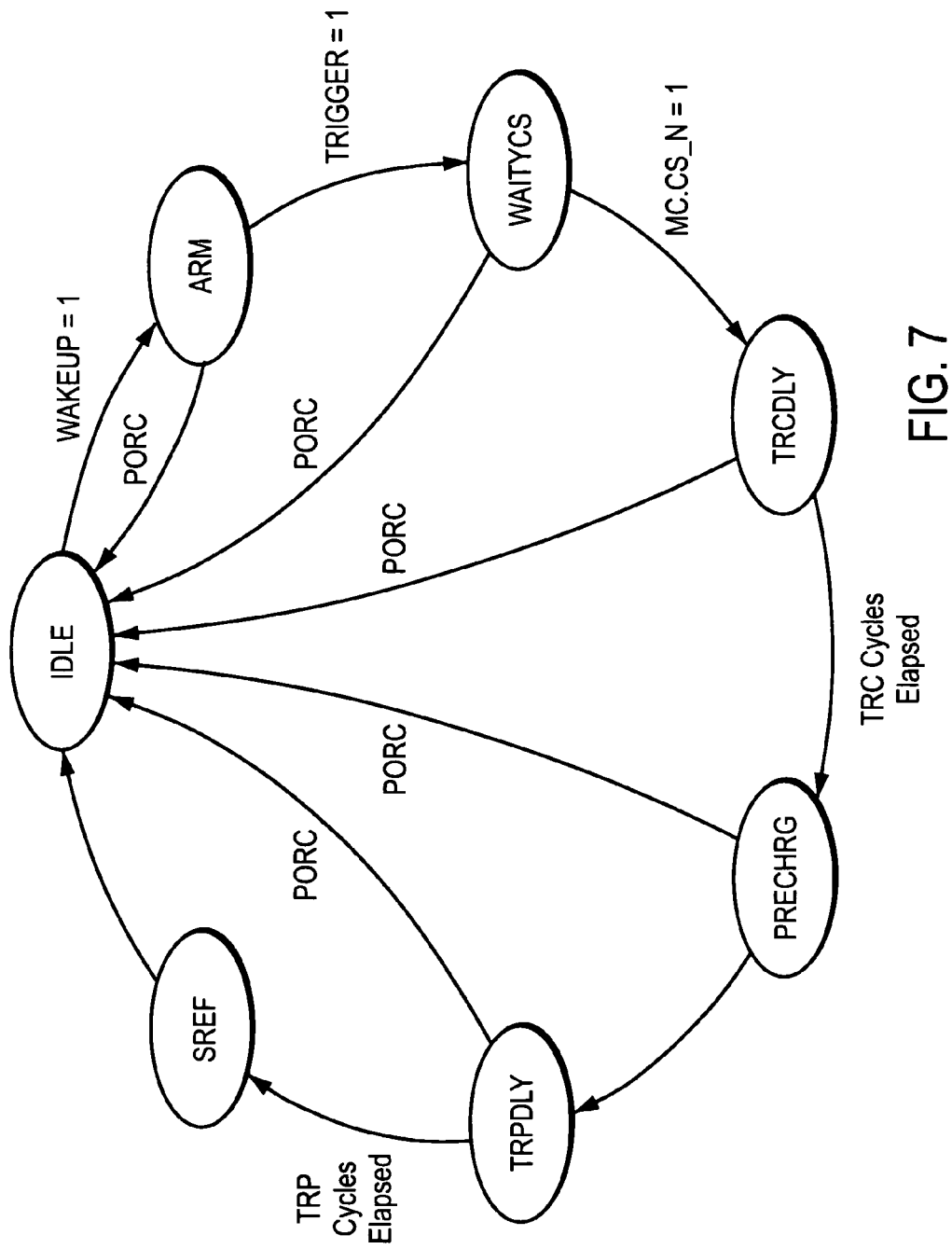
FIG. 7 is a state diagram illustrating the operation of the PFSM.

FIG. 7 is a state diagram illustrating the operation of the PFSM 71, according to an embodiment of the invention. The PFSM 71 is a state machine that can be built from conventional sequential logic elements. As shown, the PFSM 71 has seven states: IDLE, ARM, WAT4CS, TRCDLY, PRECHRG, TRPDLY and SREF. The PFSM 71 is normally in the IDLE state either when the DRAM 42 is in the self-refresh state or before the system has been initialized when PORC is asserted. The PORC signal is asserted only upon power-up of the system and is used to asynchronously reset the PFSM 71. When PORC is asserted, the PFSM 71 is forced into the IDLE state. The IDLE state is characterized by SEL=0, PF.CKE=0 and PF.{RAS_N, CAS_N, WE_N, CS_N}=1111. When in the IDLE state, the PFSM 71 will remain in that state until WAKEUP is asserted. WAKEUP is a signal issued by the system to wakeup DRAM 42 from the self-refresh state. In a given implementation, WAKEUP can be the clock enable signal output by the memory controller, if that signal is predictable during power on conditions. Otherwise, WAKEUP can originate from an external register circuit that software can write to when it is necessary to bring DRAM out of the self-refresh state.

If WAKEUP is asserted, then the PFSM 71 transitions from the IDLE state to the ARM state, in which the PFSM 71 waits for a trigger event. The ARM state is characterized by SEL=1, PF.CKE=1 and PF.{RAS_N, CAS_N, WE_N, CS_N}=1111. When in the ARM state, the PFSM 71 waits in that state until TRIGGER is asserted. Typically TRIGGER is the output of a reset "funnel", i.e., a logic OR of multiple conditions which should cause a reset.

If TRIGGER is asserted, the PFSM 71 transitions to the WAIT4CS state. The WAIT4CS is a state in which the PFSM 71 waits for DRAM 42 to become inactive (a memory operation may have been in progress when TRIGGER was asserted). The WAIT4CS state is characterized by SEL=1, PF.CKE=1 and PF.{RAS_N, CAS_N, WE_N, CS_N}=1111. When in the WAIT4CS state, the PFSM 71 remains in this state until MC.CS_N is de-asserted (equal to 1) in which case the PFSM 71 transitions to the TRCDLY state.

Upon entering the TRCDLY state, the PFSM 71 waits for a predetermined number tRC of cycles of PF.CLK, after which the PFSM 71 transitions to the PRECHRG (precharge) state. The value of tRC is dependent upon the speed of the DRAM 42. For example, for a DDR266 SDRAM, a value of tRC=65 ns (9 cycles) is believed to be suitable. The TRCDLY state is characterized by SEL=0, PF.CKE=1 and PF.{RAS_N, CAS_N, WE_N, CS_N}=1111.

In the PRECHRG state, the PFSM 71 drives out the PRE_CHARGE ALL command to the DRAM 42. The PRECHRG state is characterized by SEL=0, PF.CKE=1 and PF.{RAS_N, CAS_N, WE_N, CS_N}=0100. From the PRECHRG state, the PFSM 71 normally transitions immediately to the TRPDLY state (unless PORC is asserted).

The TRPDLY state is characterized by SEL=0, PF.CKE=1 and PF.{RAS_N, CAS_N, WE_N, CS_N}=1111. Upon entering the TRPDLY state, the PFSM 71 waits for a predetermined number tRP of cycles of PF.CLK, after which the PFSM 71 transitions to the SREF (self-refresh) state. The value of tRP is dependent upon the speed of the DRAM 42. For example, for a DDR266 SDRAM, a value of tRP=20 ns (3 cycles) is believed to be suitable.

In the SREF state, the PFSM 71 drives out the SELF REFRESH command to the DRAM 42. This state is characterized by SEL=0, PF.CKE=0 and PF.{RAS_N, CAS_N, WE_N, CS_N}=0010. From the SREF state, the PFSM 71 transitions immediately to the IDLE state.

It can be seen that the SRMC 16 in the embodiments described above is a purely hardware-based solution for placing DRAM into a self-refresh state, which is advantageous for the reasons stated above. Note, however, that other approaches may be used, which may be less advantageous yet still beneficial. For example, in alternative embodiments, the SRMC 16 can be in the form of a programmable microcontroller or function-specific processor, although such a solution would tend to be more complex and more prone to failure than the embodiments described above. As another alternative embodiment, a software-based SRMC might still be useful if it is implemented in software separate from (and independent of) the operating system and is not vulnerable to hangs or crashes of the operating system.

Thus, circuitry which is external to a memory controller to place non-volatile DRAM into a self-refresh state has been described. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. An apparatus comprising:
    a memory controller to generate a first plurality of memory control signals for controlling a dynamic random access memory that has self-refresh capability; and
    a self-refresh circuit external to the memory controller to place the memory into a self-refresh state in response to a predetermined condition, the self-refresh circuit including a state machine to generate a second plurality of memory control signals for controlling the memory based on a plurality of input signals, each of the second plurality of memory control signals corresponding to a separate one of the first plurality of memory control signals, the self-refresh circuit to select between the first plurality of memory control signals and the second plurality of memory control signals to provide to the memory, based on the plurality of input signals, the self-refresh circuit including a clock generator to receive as input a first clock signal from the memory controller and to output a second clock signal to the memory, the clock generator including a phase locked loop maintaining the second clock signal after a stoppage of the first clock signal to enable the memory to be placed into the self-refresh state.

2. An apparatus as recited in claim 1, wherein operation of the self-refresh circuit does not require or involve software.

3. An apparatus as recited in claim 1, wherein the memory is a form of synchronous dynamic random access memory.

4. An apparatus as recited in claim 1, wherein the self-refresh circuit comprises:
    a state machine to receive the plurality of control signals and to generate the second plurality of memory control signals; and a plurality of multiplexers coupled to the state machine and to the memory.

5. An apparatus as recited in claim 1, further comprising a power management and selection circuit to receive power from a primary power source and from an auxiliary power source and to provide power to the memory from the primary power source when a level of the primary power source satisfies a predetermined condition and from the auxiliary power source when the level of the primary power source does not satisfy the predetermined condition.

6. An apparatus as recited in claim 1, wherein the predetermined condition is assertion of a trigger signal, and wherein the trigger signal is asserted in response to occurrence of any of a plurality of different conditions previously determined to require a reset, said plurality of different conditions not involving any loss of power.

7. An apparatus as recited in claim 1, wherein the state machine responds to the predetermined condition by entering a wait state to enable the memory to complete an in-progress memory operation, and wherein the state machine causes the memory to enter a precharge state only after the wait state has been completed.

8. A self-refresh management circuit for use in a processing system that includes a dynamic random access memory that has self-refresh capability and a memory controller to control the memory, the self-refresh management circuit comprising:
a state machine, external to the memory controller, to generate a set of memory control signals for controlling the memory, to cause the memory to enter a self-refresh state in response to assertion of a trigger signal, the set of memory control signals corresponding to a separate set of memory control signals output by the memory controller;
a multiplexer circuit, external to the memory controller, to receive and select between the set of memory control signals from the state machine and the set of memory control signals from the memory controller, in response to a selection signal from the state machine; and
a clock generator to receive as input a first clock signal from the memory controller and to output a second clock signal to the memory and a third clock signal to the state machine, the clock generator including a phase locked loop maintaining the second clock signal after a stoppage of the first clock signal to enable the memory to be placed into the self-refresh state.

9. A self-refresh management circuit as recited in claim 8, wherein operation of the self-refresh management circuit does not require or involve software.

10. A self-refresh management circuit as recited in claim 8, wherein the memory is a form of synchronous dynamic random access memory.

11. A self-refresh management circuit as recited in claim 8, wherein the trigger signal is asserted in response to any of a plurality of different conditions previously determined to require a reset, said plurality of different conditions not involving any loss of power.

12. A self-refresh management circuit as recited in claim 8, wherein the state machine responds to the trigger signal by entering a wait state to enable the memory to complete an in-progress memory operation, and wherein the state machine causes the memory to enter a precharge state only after the wait state has been completed.

13. A self-refresh management circuit for use in a processing system that includes a processor, a dynamic random access memory that has self-refresh capability coupled to the processor, and a memory controller to generate a first plurality of memory control signals for controlling the memory, the self-refresh management circuit comprising:
a state machine external to the memory controller and having a plurality of states selected according to a first plurality of input signals, the state machine to generate a second plurality of memory control signals for controlling the memory according to a state of the state machine and to place the memory into a self-refresh state in response to assertion of a trigger signal, wherein the trigger signal is asserted in response to any of a plurality of different conditions previously determined to require a reset, said conditions not involving any loss of power, each of the second plurality of memory control signals corresponding to a separate one of the first plurality of memory control signals, the state machine further to output a selection signal according to the state of the state machine;
a plurality of multiplexers external to the memory controller, each having a first input and a second input and providing an output memory control signal to the memory to control the memory, each of the multiplexers to receive a separate one of the first plurality of memory control signals at the first input and a separate one of the second plurality of memory control signals at the second input and to select between the first input and the second input, according to the selection signal, to determine the output memory control signal; and
a clock generator to receive as input a first clock signal from the memory controller and to output a second clock signal to the memory, the clock generator including a phase locked loop maintaining the second clock signal after a stoppage of the first clock signal to enable the memory to be placed into the self-refresh state.

14. An apparatus as recited in claim 13, wherein operation of the self-refresh circuit does not require or involve software.

15. A self-refresh management circuit as recited in claim 13, wherein the memory is a form of synchronous dynamic random access memory.

16. A self-refresh management circuit as recited in claim 13, wherein the state machine responds to the trigger signal by entering a wait state to enable the memory to complete an in-progress memory operation, and wherein the state machine causes the memory to enter a precharge state only after the wait state has been completed.

17. A storage system apparatus comprising:
a processor;
a storage interface coupled to the processor to allow data communication with a plurality of non-volatile mass storage devices;
a network interface coupled to the processor to allow data communication with a remote processing system over a network;
a dynamic random access memory that has self-refresh capability, coupled to the processor;
a memory controller to control the memory; and
a self-refresh management circuit coupled to the memory external to the memory controller, the self-refresh management circuit including
a state machine to generate a plurality of memory control signals for controlling the memory and to cause the memory to enter a self-refresh state in response to assertion of a trigger signal, wherein the trigger signal is asserted in response to any of a plurality of different conditions previously determined to require a reset, said conditions not involving any loss of power, the plurality of memory control signals corresponding to a separate plurality of memory control signals output by the memory controller, and a plurality of multiplexers, each to receive and select between a separate one of the plurality of memory control signals from the state machine and a corresponding separate one of the plurality of memory control signals from the memory controller, in response to a selection signal from the state machine; and a clock generator to receive as input a first clock signal from the memory controller and to output a second clock signal to the memory and a third clock signal to the state machine, the clock generator including a phase locked loon maintaining the second clock signal after a stoppage of the first clock signal to enable the memory to be placed into the self-refresh state.

18. A storage system apparatus as recited in claim 17, wherein operation of the self-refresh management circuit does not require or involve software.

19. A storage system apparatus as recited in claim 17, wherein the memory is a form of synchronous dynamic random access memory.

20. A storage system apparatus as recited in claim 17, wherein the state machine responds to the trigger signal by entering a wait state to enable the memory to complete an in-progress memory operation, and wherein the state machine causes the memory to enter a precharge state only after the wait state has been completed.

21. A method comprising:
receiving a plurality of input signals relating to operation of a processing system that includes a memory controller and a dynamic random access memory that has self-refresh capability;
receiving a first plurality of memory control signals generated by the memory controller;
generating a second plurality of memory control signals outside the memory controller, each of the second plurality of memory control signals corresponding to a separate one of the first plurality of memory control signals;
providing the second plurality of memory control signals to the memory in place of the first plurality of memory control signals, based on the plurality of control signals, to place the memory into a self-refresh state, in response to assertion of a trigger signal;
receiving a first clock signal from the memory controller;
generating a second clock signal based on the first clock signal;
providing the second clock signal to the memory; and
maintaining the second clock signal after a stoppage of the first clock signal to enable the memory to be placed into the self-refresh state, by using a phase locked loop.

22. A method as recited in claim 21, wherein said generating a second plurality of memory control signals comprises using a state machine outside the memory controller to generate the second plurality of memory control signals.

23. A method as recited in claim 22, wherein said providing the second plurality of memory control signals to the memory in place of the first plurality of memory control signals comprises using a plurality of multiplexers controlled according to a state of the state machine.

24. A method as recited in claim 21, further comprising:
receiving power from a primary power source and from an auxiliary power source;
providing power to the memory from the primary power source when a level of the primary power source satisfies a predetermined condition; and
providing power to the memory from the auxiliary power source when the level of the primary power source does not satisfy the predetermined condition.

25. A method as recited in claim 21, wherein the trigger signal is asserted in response to any of a plurality of different conditions previously determined to require a reset, said plurality of different conditions not involving any loss of power.

26. A method as recited in claim 21, wherein providing the second plurality of memory control signals to the memory in place of the first plurality of memory control signals comprises:
entering a wait state in response to the trigger signal, to enable the memory to complete an in-progress memory operation; and
causing the memory to enter a precharge state only after the wait state has been completed.

* * * * *